(12) United States Patent
Ciccarelli et al.

(10) Patent No.: US 8,390,330 B2
(45) Date of Patent: Mar. 5, 2013

(54) BASE CELL FOR IMPLEMENTING AN ENGINEERING CHANGE ORDER (ECO)

(75) Inventors: Luca Ciccarelli, Rimini (IT); Roberto Canegallo, Rimini (IT); Claudio Mucci, Bologna (IT); Massimiliano Innocenti, Urbino (IT); Valentina Nardone, Avezzano (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/096,297

(22) Filed: Apr. 28, 2011

(65) Prior Publication Data

US 2012/0001655 A1   Jan. 5, 2012

(30) Foreign Application Priority Data

Apr. 30, 2010   (IT) .......................... MI2010A000755

(51) Int. Cl.
  *H01L 25/00*    (2006.01)
  *H01L 27/118*   (2006.01)
(52) U.S. Cl. ........ 326/101; 326/103; 257/204; 257/206; 257/369; 257/401; 257/E27.06
(58) Field of Classification Search .................. 326/101, 326/103; 716/17, 12; 257/369, 401, 204, 257/206, 208, 532
See application file for complete search history.

(56) References Cited

U.S. PATENT DOCUMENTS

| | | | | |
|---|---|---|---|---|
| 7,137,094 B2* | 11/2006 | Tien | .............................. | 716/119 |
| 7,698,680 B2* | 4/2010 | Kim | .............................. | 716/129 |
| 7,965,107 B2* | 6/2011 | Ciccarelli et al. | ............. | 326/101 |
| 2005/0189569 A1 | 9/2005 | Hartwig | | |
| 2005/0235240 A1 | 10/2005 | Tien | | |
| 2006/0097395 A1 | 5/2006 | Cheng et al. | | |
| 2006/0199325 A1 | 9/2006 | Maeno et al. | | |
| 2007/0157151 A1* | 7/2007 | Kim | .............................. | 716/17 |
| 2012/0075920 A1* | 3/2012 | Nardone et al. | ............. | 365/154 |

OTHER PUBLICATIONS

Chen et al., "New Spare Cell Design for IR Drop Minimization in Engineering Change Order," Design Automation Conference, DAC '09 45th ACM/IEEE, IEEE, Piscataway, New Jersey, Jul. 26, 2009, pp. 402-407.
"CMOS," Internet Citation, Apr. 24, 2010, pp. 1-6.

* cited by examiner

*Primary Examiner* — Vibol Tan
(74) *Attorney, Agent, or Firm* — Allen, Dyer, Doppelt, Milbrath & Gilchrist, P.A.

(57) ABSTRACT

A circuit base cell is for implementing an engineering change order (ECO) obtained on a semiconductor substrate. The base cell may include a PMOS transistor having a first active region obtained in a first diffusion P+ layer implanted in an N-well provided for on the substrate, and an NMOS transistor having a second active region obtained in a second diffusion N+ layer implanted on the substrate in such a manner as to be electrically insulated from the first diffusion P+ layer. The cell may be characterized in that the active regions and the diffusion layers are aligned therebetween with respect to a reference axis and they are extended symmetrically in the direction orthogonal to the axis. A first and a second width may be associated with the active regions and to the diffusion layers, respectively. The first and second width may be greater than a width of the cell, which is equivalent to a pitch of the standard minimum cell.

18 Claims, 2 Drawing Sheets

BASE CELL FOR IMPLEMENTING AN ENGINEERING CHANGE ORDER (ECO)

FIELD OF THE INVENTION

An object of the present invention is a circuit base cell for implementing an engineering change order (ECO), in particular, a circuit base cell programmable by modifying levels of metal to change logic functionalities of the device before or after manufacturing thereof on silicon.

BACKGROUND OF THE INVENTION

A traditional ASIC (Application Specific Integrated Circuit) project for an integrated electronic circuit, for example, of the digital type, may provide for a definition of the specifications of the circuit and a description thereof by way of a programming language (software). In a subsequent synthesis operation, the description of the circuit is used for transforming the project into a list of components, i.e. into logic cells, and connections between the cells which provide macroblocks to be implemented via circuitry (hardware). The list of components and connections or netlist is transformed into a physical drawing or layout of the digital circuit using commercial CAD software.

In particular, the layout of the circuit comprises single or multiple cells belonging to a standard cell library suitable to operate in a combinatory manner (for example, Inverter, NAND, NOR) and in a sequential manner (for example, Flip Flop, Latch). Depending on the complexity of the ASIC, the layout of the digital circuit may comprise multiple base layers, multiple contacts and multiple metal layers. The procedure for providing models of layers is commonly referred to as tape-out.

Modifications for eliminating, or adding, logic elements and interconnections from the initial layout of the circuit are used after tape-out to perform subsequent project variations. When this occurs, an engineering change order (ECO) is generated to document the desired variations.

In typical EGO methods, supplementary logic spare cells, or configurable filler cells, of different type are included in the initial computerized layout as reserves in case new elements are required or implementation of new functionalities in the circuit structure is required. Traditionally, the CAD software operates to place and route the cells on a grid having a pitch defined by the technological process. Generally, the space between two adjacent cells in the grid is null or multiple with respect to the pitch.

In each technology for semiconductor integrated circuits, the pitch of the placement grid is equivalent to the width of the smallest filler cell available for that technology. For example, a minimum pitch value $P_m$ is calculated by the relation:

$$P_m = 2.5 \times l;$$

where L is the channel length characteristic of the technology employed.

In conventional EGO applications, the digital filler cells included in the layout have a width equivalent to a multiple of the minimum pitch value $P_m$ of the standard minimum cell of the technology. The typical ECO cells may reveal disadvantages related to the placing and interconnection thereof according to the space restrictions defined in the layout. Furthermore, the typical ECO approaches may use excessive area on the silicon chip mostly to the detriment of the applications.

SUMMARY OF THE INVENTION

An object of the present invention is that of conceiving and providing a circuit base cell for an engineering change order (ECO) having efficient structural characteristics.

This object may be attained with a circuit base cell for implementing an engineering change order (ECO) on a substrate of semiconductor material and having a circuit base cell width, and the substrate having an N-well. The circuit base cell may comprise a P-type metal-oxide-semiconductor (PMOS) transistor comprising a first diffusion layer, a first active region in the first diffusion layer and implanted in the N-well on the substrate, and an N-type metal-oxide-semiconductor (NMOS) transistor comprising a second diffusion layer, a second active region in the second diffusion layer and implanted directly on the substrate to be electrically insulated from the first diffusion layer. The first and second active regions and the first and second diffusion layers may be aligned with respect to a reference axis and may be extending symmetrically in a direction orthogonal to the reference axis. The first and second active regions may each have a first width. The first and second diffusion layers may each have a second width, the first and second widths being greater than the circuit base cell width.

BRIEF DESCRIPTION OF THE DRAWINGS

Further characteristics and advantages of the circuit base cell of ECO type may be clear from the following description of an exemplary embodiment, provided for indicative and non-limiting purposes, with reference to the attached figures, wherein.

DETAILED DESCRIPTION OF THE PREFERRED EMBODIMENTS

Figure 1:
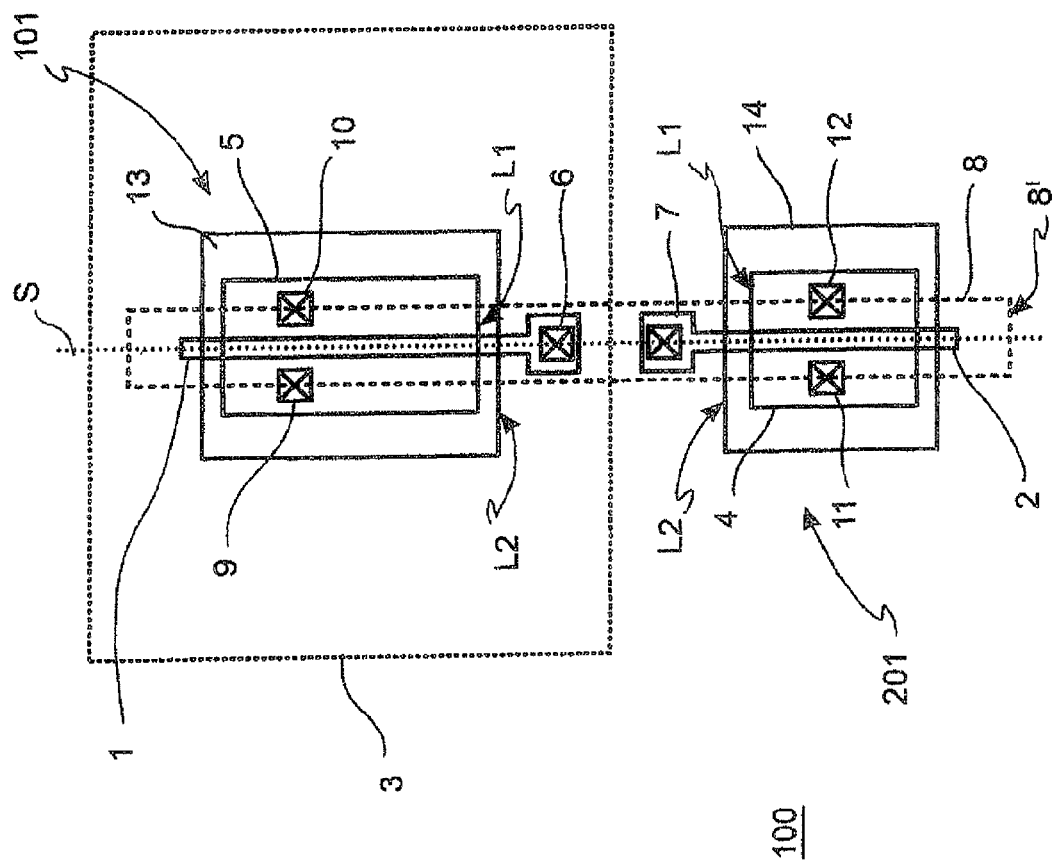
FIG. 1 shows a top view of the layout of an ECO circuit base cell, according to the present invention.

Referring to FIG. 1, an embodiment of a layout of a base cell for implementing an engineering change order (ECO) according to the present invention is indicated with 100. In particular, it should be observed that the base cell 100 has a symmetric structure with respect to a virtual central reference axis S, with respect to which all the diffusion areas and the areas of the implants of material layers are substantially mirror-like.

It should be observed that a plurality of the base cells 100 are included in the initial computerized layout of an integrated circuit (IC) as reserves to be used in case new elements are required or implementation of new functionalities is required. In particular, the cells 100 are positioned on a grid having a pitch defined by the technological process by way of CAD software of the conventional place-and-route type. This approach allows optimizing this aspect, hence not requiring providing a multiple pitch of the technological pitch like in the previous approaches.

The base cell 100 comprises, advantageously, a PMOS transistor 101 and an NMOS transistor 201, obtained on a semiconductor material substrate. In particular, the layout of the cell 100 comprises an N-well 3 which provides the substrate wherein the PMOS transistor 101 is formed. Furthermore, a first doped diffusion region or P+ layer 13 is implanted in the N substrate 3. Found in the doped diffusion P+ region 13 is a first active region 5 of the PMOS transistor. The first active region 5 forms the source and drain regions of the PMOS transistor 101.

Analogously, a second doped diffusion region or N+ layer 14 is implanted directly on the semiconductor substrate which receives the base cell 100. Inserted in the second diffusion N+ region 14 is a second active region 4 suitable to form the source and drain regions of the NMOS transistor 201. It should be observed that the first 13 and the second 14 diffusion layers are aligned with respect to each other along the reference axis S, and they are electrically insulated with respect to each other. Furthermore, the first 5 and second 4 active regions are aligned with respect to each other along the reference axis S, and they are electrically insulated with respect to each other.

The PMOS transistor 101 also comprises a first drain contact 10 and a first source contact 9. Analogously, the NMOS transistor 201 comprises a second drain contact 12 and a second source contact 11. Given that the EGO base cell 100 has a symmetric structure, the terminals of the drain and source of the PMOS 101 and NMOS 201 transistors are invertible with respect to each other.

A first gate contact 6 associated with the PMOS transistor 101 and a second gate contact 7 associated with the NMOS transistor 201 are obtained outside the first active region 5 and the second active region 4 of the transistors. A first 1 and a second 2 control terminal are connected to the gate contacts 6 and 7, respectively. The first 1 and second 2 control terminals are, preferably, made of polycrystalline silicon or polysilicon.

It should be observed that the first 6 and the second 7 gate contacts are positioned along the symmetry axis S of the cell 100. Furthermore, the first control terminal 1 connected to the first contact 6 is extended along the symmetry axis S in the direction opposite to the second gate contact 7. Analogously, the second control terminal 2 connected to the second contact 7 is extended along the axis S in the direction opposite to the first gate contact 6. Therefore, the first 1 and the second 2 control terminals are aligned with respect to each other.

Advantageously, in a condition of disengagement of the cell 100 in the integrated circuit, i.e. in case the cell 100 is not involved in implementing a function inside the layout of the integrated circuit, the first 1 and second 2 control terminals of the PMOS 101 and NMOS 201 transistors are kept floating, i.e. they are not connected to any power supply terminal. Furthermore, in the condition of disengagement, the first drain 10 and source 9 contacts of the PMOS transistor 101 may be connected to a first upper power supply potential of the circuit VDD1, and the second drain 12 and source 11 contacts of the NMOS transistor may be connected to a second lower power supply potential VSS1.

Referring to FIG. 1, a perimeter of the ECO base cell 100 is shown by a dashed rectangle marked by reference 8. The size of a smaller side 8' of the rectangle 8 represents the width or pitch of the cell 100. Advantageously, the ECO base cell 100 has a width equivalent to the minimum pitch, i.e. it has a pitch equivalent to that of the minimum cell of the standard library implemented in the reference technology. In such manner, the cell 100 may be connected to the standard cells of the layout to obtain complex logic functions optimizing the area generally occupied by the circuit.

It should be observed that, advantageously, in the ECO base cell 100, the physical scheme of the layout and thus the technological manufacturing process are such that the diffusion P+ layers 13 of the PMOS transistor and diffusion N+ layers 14 of the NMOS transistor are extended spatially in a symmetric manner in the direction substantially orthogonal to the symmetry axis S outside the rectangular perimeter 8 of the cell. Furthermore, the physical scheme of the layout and thus the technological manufacturing process are such that the first active region 5 of the PMOS transistor and the second active region 4 of the NMOS transistor are extended spatially in a symmetric manner in the direction substantially orthogonal to the symmetry axis S outside the rectangular perimeter 8 of the cell. The perimeter 8, and in particular the dimension of the side 8', is commonly used by automatic placement programs for the logic cells of the standard library to generate the scheme of the layout of the integrated circuit as the pitch of the cells.

In more detail, the first 5 and second 4 active regions of the transistors are extended symmetrically in a direction orthogonal to the symmetry axis S up to acquiring a first general width L1. Analogously, the first 13 and the second 14 diffusion layers are extended symmetrically in the direction orthogonal to the axis S up to acquiring a second width L2. The first L1 and second L2 widths are larger than the width 8' of the cell 100. A plurality of base cells or cluster of base cells 100 may be connected to each other for implementing complex logic functions, such as, for example, NAND, NOR, Flip Flop and Latch.

Figure 2:
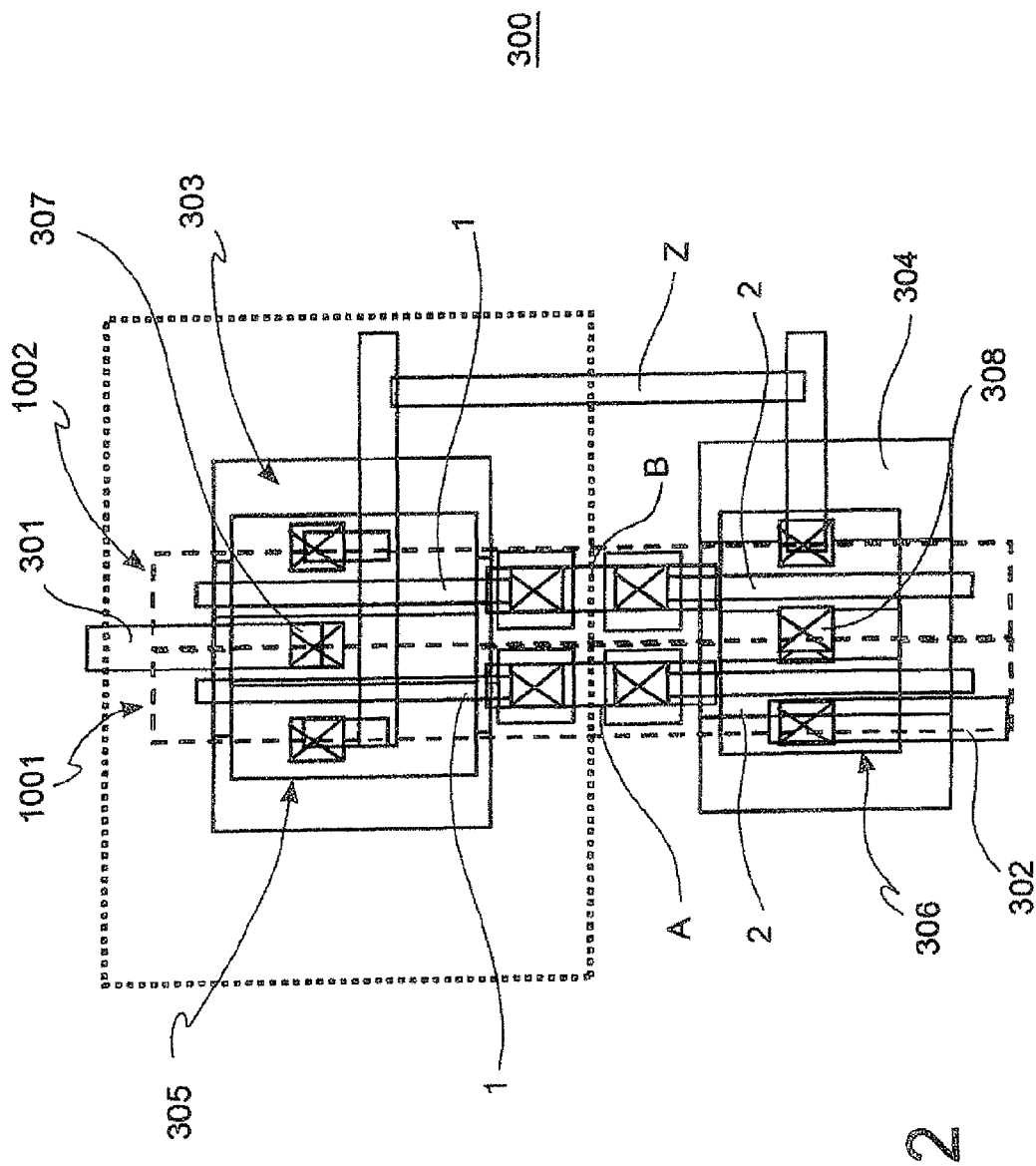
FIG. 2 shows a schematic view of the layout of a NAND logic gate implemented starting from the base cell of FIG. 1.

FIG. 2 schematically shows a layout of a NAND logic gate 300 obtained starting from the ECO base cell 100 of the present invention. In particular, the NAND logic gate 300 is obtained by connecting—to each other—two adjacent ECO cells 100, respectively a first 1001 and a second cell 1002. In FIG. 2, elements identical or analogous to those described referring to the cell 100 of FIG. 1 are indicated using the same reference numbers.

In more detail, in FIG. 2, the control terminals 1, 2 of the PMOS and NMOS transistors of the first cell 1001 are connected to each other by a first metallization to form a first input terminal A of the NAND logic gate 300 suitable to receive a first binary signal (0 or 1 logic). Analogously, the control terminals 1, 2 of the PMOS and NMOS transistors of the second cell 1002 are connected to each other by a second metallization to form a second input terminal B of the NAND gate 300 suitable to receive a second binary signal. An output binary signal is provided on a respective output terminal Z of the logic gate 300.

Furthermore, the NAND gate 300 comprises a third terminal 301 connectable to a first power supply potential VDD2, for example, an upper power supply potential, and a fourth terminal 302 connectable to a second power supply potential VSS2, for example a lower power supply potential of the circuit. It should be observed that the base cells 1001 and 1002 that form the NAND gate 300 have the respective P+ and N+ diffusion layers in common and the respective active regions 4 and 5 in common. In particular, the first diffusion layers P+ 13 of the PMOS transistors 101 of the cells 1001, 1002 are in common and the second diffusion layers N+ 14 of the NMOS transistors 201 of the same cells are in common. Furthermore, the first active regions 5 of the PMOS transistors 101 of the cells 1001, 1002 are in common and the second active regions 4 of the transistors NMOS 201 are in common. The common layers form a first 303 and a second 304 overall diffusion layer and a first 305 and a second 306 overall active region. Therefore, the diffusion masks and those of the active regions employed in the integrated process on silicon are regular. Furthermore, the overall NAND cell 300 advantageously comprises a first common terminal 307 of the PMOS transistors and a second common terminal 308 of the NMOS transistors.

The ECO base cell 100 has several advantages with respect the ECO approaches of the prior art. In particular, the cell 100 is configured to be connected to a suitable body contact cell adapted to provide connections between the bodies and the upper VDD1 and lower VSS1 power supply potentials. Preferably, the contact cell coincides with a contact cell of the standard cells as known to those skilled in the art. Hence, the ECO base cell 100 is not required to comprise additional diffusion layers P+ or N+ for connecting the body thereof to the upper VDD1 and lower VSS1 power supply potentials. Thus, the ECO cell 100 does not have body contacts.

In this manner, the cell 100 guarantees lower occupation of the silicon area with respect to the known cells simultaneously allowing greater flexibility when connecting to the standard cells. Furthermore, given that the pitch of the cell 100 is identical to that of the standard library cells, the placement programs may arrange them either in filler zones or in empty spaces (as it occurs for example in the spare cells) or combine them and/or replace them with standard library cells without modifying the functionalities. Therefore, the ECO base cell 100 ensures high flexibility. In addition, the low occupation of the silicon area of the cell 100 allows increasing the number of cells placed on the semiconductor chip per unit area. Therefore, considering the same number of filler cells employed, an integrated circuit comprising ECO cells 100 occupies a smaller area with respect to a circuit which employs the traditional ECO cells with ensuing savings in terms of costs of silicon and the development process.

The embodiments of the ECO base cell described above may be subjected, by one skilled in the art to meet contingent requirements, to modifications, adaptations and replacement of elements with other functionally equivalent elements without departing from the scope of protection of the following claims.

What is claimed is:

1. A circuit base cell for implementing an engineering change order (ECO) on a substrate of semiconductor material, the substrate having an N-well thereon, the circuit base cell comprising:
    a P-type metal-oxide-semiconductor (PMOS) transistor comprising a first diffusion layer, and a first active region in said first diffusion layer and being in the N-well on the substrate; and
    an N-type metal-oxide-semiconductor (NMOS) transistor comprising a second diffusion layer, and a second active region in said second diffusion layer and being on the substrate to be electrically insulated from said first diffusion layer;
    said first and second active regions and said first and second diffusion layers being aligned with respect to a reference axis and extending symmetrically in a direction orthogonal to the reference axis;
    said first and second active regions each having a first width, said first and second diffusion layers each having a second width, the first and second widths each being greater than a circuit base cell width, the circuit base cell width defining a pitch.

2. The circuit base cell according to claim 1 wherein said PMOS transistor comprises a first control terminal; and wherein said NMOS transistor comprises a second control terminal aligned with said first control terminal and electrically insulated from said first control terminal.

3. The circuit base cell according to claim 2 wherein said first and second control terminals are kept floating in a condition of disengagement.

4. A circuit base cell comprising:
    a first metal-oxide-semiconductor (MOS) transistor comprising a first diffusion layer, and a first active region in said first diffusion layer; and
    a second MOS transistor comprising a second diffusion layer, and a second active region in said second diffusion layer and being electrically insulated from said first diffusion layer;
    said first and second active regions and said first and second diffusion layers being aligned with respect to a reference axis and extending symmetrically in a direction orthogonal to the reference axis;
    said first and second active regions each having a first width, said first and second diffusion layers each having a second width, the first and second widths each being greater than a circuit base cell width value.

5. The circuit base cell according to claim 4 wherein said first MOS transistor comprises a first control terminal; and wherein said second MOS transistor comprises a second control terminal aligned with said first control terminal and electrically insulated from said first control terminal.

6. The circuit base cell according to claim 5 wherein said first and second control terminals are kept floating in a condition of disengagement.

7. A functional logic cell comprising:
    a plurality of adjacent base cells, each base cell having a circuit base cell width and comprising
        a P-type metal-oxide-semiconductor (PMOS) transistor comprising a first diffusion layer, and a first active region in said first diffusion layer, and
        an N-type metal-oxide-semiconductor (NMOS) transistor comprising a second diffusion layer, and a second active region in said second diffusion layer and electrically insulated from said first diffusion layer,
        said first and second active regions and said first and second diffusion layers being aligned with respect to a reference axis and extending symmetrically in a direction orthogonal to the reference axis,
        said first and second active regions each having a first width, said first and second diffusion layers each having a second width, the first and second widths each being greater than the circuit base cell width, the circuit base cell width defining a pitch.

8. The functional logic cell according to claim 7 wherein at least some base cells comprise respective first diffusion layers and first active regions in common and respective second diffusion layers and second active regions in common.

9. The functional logic cell according to claim 7 wherein said plurality of adjacent base cells is configured for implementing at least one of combinatory and sequential functions.

10. The functional logic cell according to claim 9 wherein the combinatory and sequential functions comprise at least one of an inverter, a NAND gate, a NOR gate, a flip flop device, and a latch device.

11. The functional logic cell according to claim 7 wherein said PMOS transistor comprises a first control terminal; and wherein said NMOS transistor comprises a second control terminal aligned with said first control terminal and electrically insulated from said first control terminal.

12. The functional logic cell according to claim 11 wherein said first and second control terminals are kept floating in a condition of disengagement.

13. A method of making a circuit base cell comprising:
    forming a first metal-oxide-semiconductor (MOS) transistor comprising a first diffusion layer, and a first active region in the first diffusion layer;
    forming a second MOS transistor comprising a second diffusion layer, and a second active region in the second diffusion layer and being electrically insulated from the first diffusion layer;

forming the first and second active regions and the first and second diffusion layers to be aligned with respect to a reference axis and extend symmetrically in a direction orthogonal to the reference axis; and the first and second active regions each having a first width, the first and second diffusion layers each having a second width, the first and second widths each being greater than a circuit base cell width, the circuit base cell width defining a pitch.

14. The method according to claim 13 further comprising forming the first MOS transistor to comprise a first control terminal, and forming the second MOS transistor to comprise a second control terminal aligned with the first terminal and electrically insulated from the first terminal.

15. The circuit base cell according to claim 1 wherein said first diffusion layer is continuous; and wherein said second diffusion layer is continuous.

16. The circuit base cell according to claim 4 wherein said first diffusion layer is continuous; and wherein said second diffusion layer is continuous.

17. The functional logic cell according to claim 7 wherein said first diffusion layer is continuous; and wherein said second diffusion layer is continuous.

18. The method according to claim 13 wherein said first diffusion layer is continuous; and wherein said second diffusion layer is continuous.

\* \* \* \* \*